US010964258B2

(12) United States Patent
Ooyama

(10) Patent No.: US 10,964,258 B2
(45) Date of Patent: Mar. 30, 2021

(54) DISPLAY DEVICE AND DRIVING METHOD FOR DISPLAY DEVICE

(71) Applicant: Japan Display Inc., Tokyo (JP)

(72) Inventor: Atsunori Ooyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/797,473

(22) Filed: Feb. 21, 2020

(65) Prior Publication Data
US 2020/0312239 A1    Oct. 1, 2020

(30) Foreign Application Priority Data
Mar. 29, 2019    (JP) .............................. JP2019-065852

(51) Int. Cl.
*G09G 3/3225* (2016.01)
*G09G 3/3266* (2016.01)
*H01L 27/32* (2006.01)

(52) U.S. Cl.
CPC ......... *G09G 3/3225* (2013.01); *G09G 3/3266* (2013.01); *G09G 2300/0426* (2013.01); *G09G 2330/021* (2013.01); *H01L 27/3248* (2013.01); *H01L 27/3262* (2013.01); *H01L 27/3265* (2013.01); *H01L 27/3276* (2013.01)

(58) Field of Classification Search
CPC combination set(s) only.
See application file for complete search history.

(56) References Cited

U.S. PATENT DOCUMENTS

2004/0051690 A1    3/2004 Chang
2020/0013838 A1*   1/2020 Takechi .............. H01L 27/3248

* cited by examiner

*Primary Examiner* — Deeprose Subedi
(74) *Attorney, Agent, or Firm* — Michael Best & Friedrich LLP

(57) ABSTRACT

A display device is provided. The display device includes a display region. The display region has a plurality of pixels. Each of the plurality of pixels comprises a switching transistor having a gate electrically connected to a scanning line and controlling the input of an image signal provided from a signal line, a drive transistor input with the image signal through the switching transistor and controlling a current value based on the image signal, a display element having a first electrode electrically connected to the driving transistor and emitting light by a current supplied through the drive transistor, a storage capacitor having a first electrode electrically connected to a gate of the drive transistor, and a reset transistor connected between the first electrode of the display element and a reset line, and having a gate electrically connected to the scanning line.

6 Claims, 7 Drawing Sheets

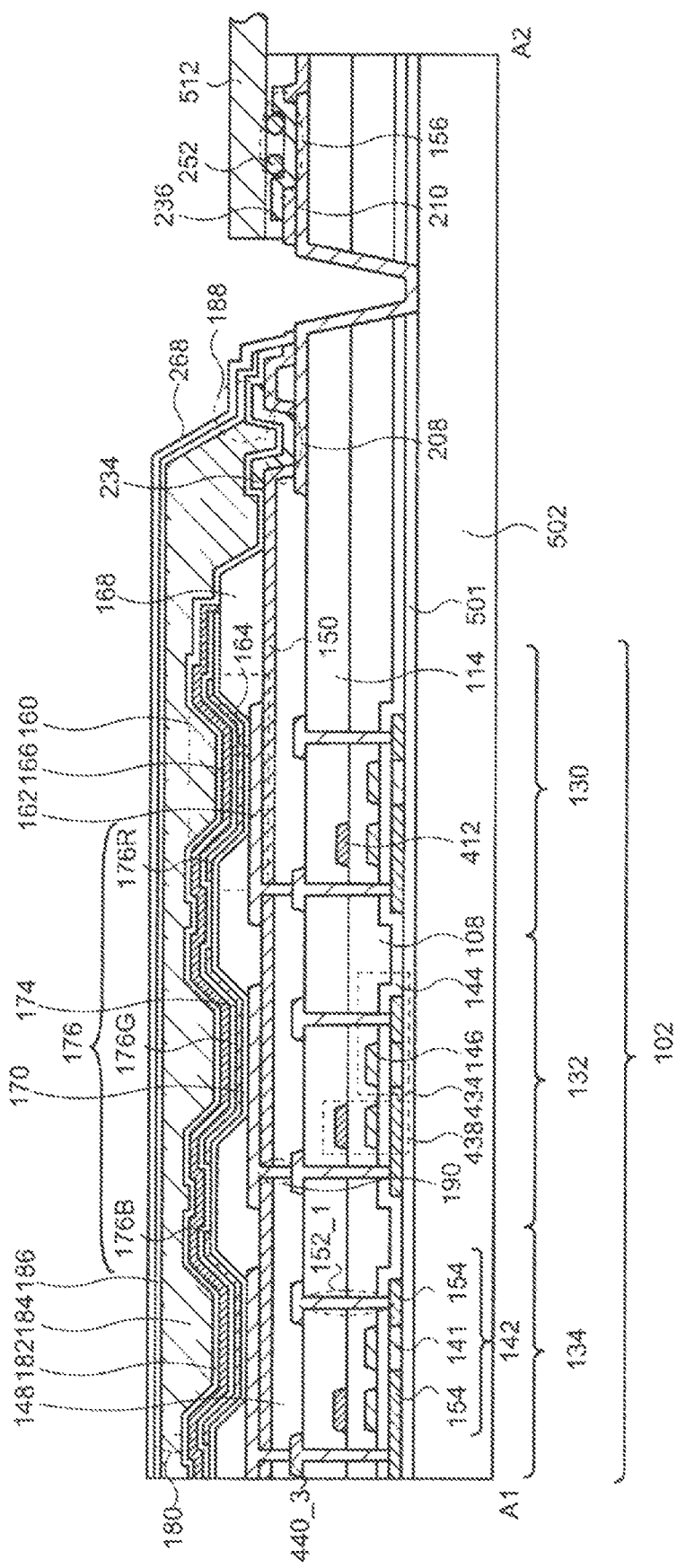

DISPLAY DEVICE AND DRIVING METHOD FOR DISPLAY DEVICE

CROSS REFERENCE TO RELATED APPLICATIONS

This application is based upon and claims the benefit of priority from the prior Japanese Patent Application No. 2019-065852, filed on Mar. 29, 2019, the entire contents of which are incorporated herein by reference.

FIELD

An embodiment of the present invention relates to a display device and a driving method for display device. In particular, the present invention relates to a display device driving method using a self-luminous element, typically an organic EL (Electroluminescence) element, as a display element.

BACKGROUND

A liquid crystal display device and an organic EL display device are exemplified as the flat panel display device. In these display devices, a display region in which a plurality of display elements are arranged in a matrix is arranged with a signal line group extending in a first direction and a scan line group extending in a second direction intersecting the first direction, and an image is displayed by individually controlling the signal line group and the scan line group.

A number of organic EL display devices include an initialization operation before writing an image signal in the next display frame following a certain display frame. Here, for example, the initialization operation includes the following operation: the operation state of each display element in the immediately preceding display frame is forcibly unified to a state in which all pixels are non-display state, and the operation state is prepared for the writing of a subsequent video signal. In addition, this initialization operation can be seen as a forcibly operation stopping the display when seen from the immediately preceding display frame. In addition, it is possible to include this initialization operation as a period for controlling an effective display period during the entire operation period of the display device (see Japanese Laid Open Patent Publication No. 2004-102294).

SUMMARY

A display device related to one embodiment of the present invention includes a display region, the display region having a plurality of pixels, each of the plurality of pixels comprising a switching transistor having a gate electrically connected to a scanning line and controlling the input of an image signal provided from a signal line, a drive transistor input with the image signal through the switching transistor and controlling a current value based on the image signal, a display element having a first electrode electrically connected to the driving transistor and emitting light by a current supplied through the drive transistor, a storage capacitor having a first electrode electrically connected to a gate of the drive transistor, and a reset transistor connected between the first electrode of the display element and a reset line and having a gate electrically connected to the scanning line, wherein an input of an image signal to the plurality of pixels is configured to be sequentially performed at each row, the start and end of light emission of the display element are configured to be simultaneously performed in all pixels, and until the end of the input of the image signal of the first row via an input start timing of an image signal of a first row after the end of the light emission of the display element, the potential of the reset line shifts to a second reset potential lower thana first potential from the first reset potential.

Another display device related to one embodiment of the present invention includes a display region, the display region having a plurality of pixels, each of the plurality of pixels including a switching transistor having a gate electrically connected to a scanning line and controlling the input of an image signal provided from a signal line, a drive transistor input with the image signal through the switching transistor and controlling a current value based on the image signal, a display element having a first electrode electrically connected to the driving transistor and emitting light by a current supplied through the drive transistor, a storage capacitor having a first electrode electrically connected to a gate of the drive transistor, and a reset transistor connected between the first electrode of the display element and a reset line and having a gate electrically connected to the scanning line, wherein an input of an image signal to the plurality of pixels is configured to be sequentially performed at each row, the start and end of light emission of the display element are configured to be simultaneously performed in all pixels, and until up to before an input start of an image signal of the first row after the end of the light emission of the display element, the scanning lines on all of the rows are in a state where they can be simultaneously selected.

A driving method for a display device according to an embodiment of the present invention includes the display device having a display region, the display region having a plurality of pixels, each of the plurality of pixels comprising, a switching transistor having a gate electrically connected to a scanning line and controlling the input of an image signal provided from a signal line, a drive transistor input with the image signal through the switching transistor and controlling a current value based on the image signal, a display element having a first electrode electrically connected to the driving transistor and emitting light by a current supplied through the drive transistor, a storage capacitor having a first electrode electrically connected to a gate of the drive transistor, and a reset transistor connected between the first electrode of the display element and a reset line and having a gate electrically connected to the scanning line, wherein the drive transistor and the display element are connected in series between a high-potential-side power source and a low-potential-side power source lower than the high-potential-side power source, the driving method comprising the steps of, a first step of falling a potential of the high-potential-side power source, and terminating light emission of the display element at the same time in the plurality of pixels, a second step of, after terminating light emission of the display element, shifting a potential of the reset line from the first reset potential to a second reset potential lower than the first reset potential, a third step of sequentially inputting an image signal from a first row until the end row in the plurality of pixels and a fourth step of, after input of the image signal in the end row is completed, raising a potential of the high-potential-side power source, and starting light emission of a display element based on each input image signal at the same time to the plurality of pixels, and the second step finishes after the start of an input of the image signal in the first row.

Another driving method for a display device according to an embodiment of the present invention includes the display device having a display region, the display region having a plurality of pixels, each of the plurality of pixels comprising, a switching transistor having a gate electrically connected to a scanning line and controlling the input of an image signal provided from a signal line, a drive transistor input with the image signal through the switching transistor and controlling a current value based on the image signal, a display element having a first electrode electrically connected to the driving transistor and emitting light by a current supplied through the drive transistor, a storage capacitor having a first electrode electrically connected to a gate of the drive transistor, and a reset transistor connected between the first electrode of the display element and a reset line and having a gate electrically connected to the scanning line, wherein the drive transistor and the display element are connected in series between a high-potential-side power source and a low-potential-side power source lower than the high-potential-side power source, the driving method comprising the steps of, a first step of falling a potential of the high-potential-side power source, and terminating light emission of the display element at the same time in the plurality of pixels, a second step of, after terminating light emission of the display element, putting the scanning lines on all the rows into a state where they can be simultaneously selected, a third step of sequentially inputting an image signal from a first row until the end row in the plurality of pixels, and a fourth step of, after input of the image signal in the end row is completed, raising a potential of the high-potential-side power source, and starting light emission of a display element based on each input image signal at once to the plurality of pixels.

BRIEF DESCRIPTION OF DRAWINGS

FIG. 7 is a diagram showing a process structural example of a display device related to one embodiment of the present invention.

DESCRIPTION OF EMBODIMENTS

Figure 1:
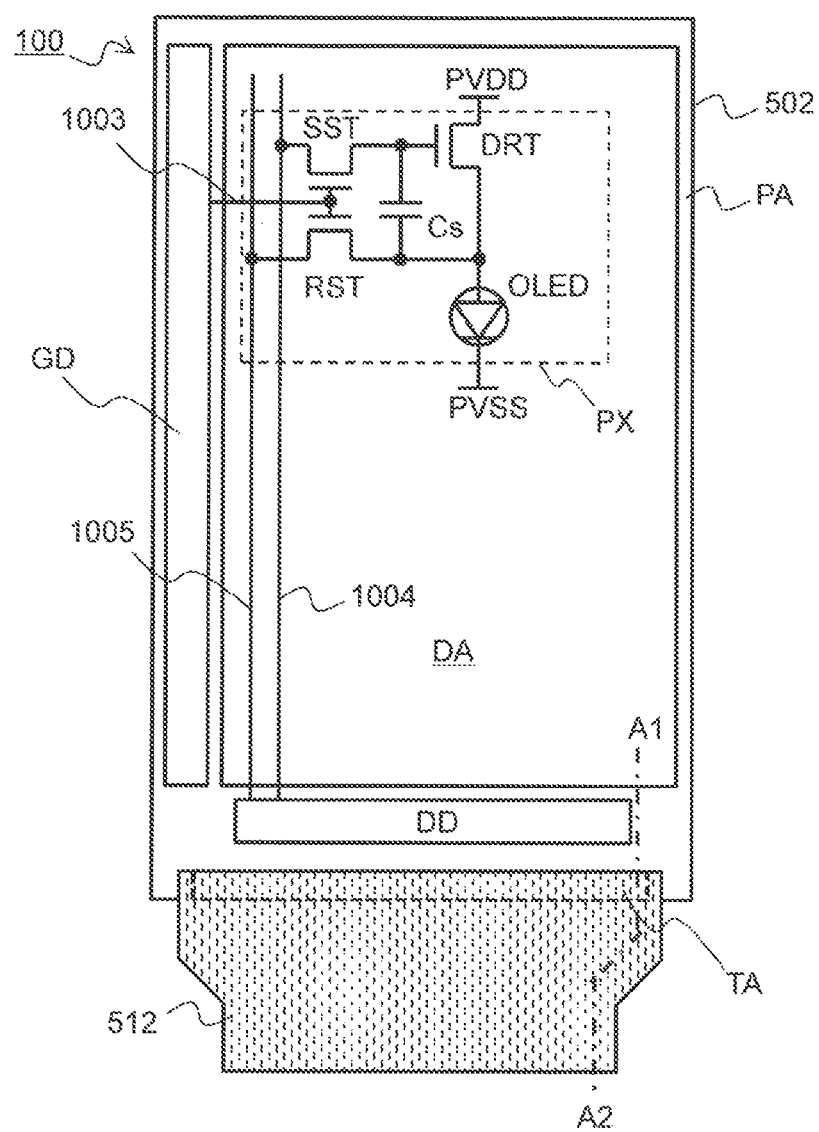
FIG. 1 is a diagram showing a structure of a display device related to one embodiment of the present invention.

Each embodiment of the present invention is explained below with reference to the drawings. However, the present invention can be carried out in various modes without departing from the gist of the present invention, and should not be construed as being uniformly limited to the content of the description of the embodiments exemplified below.

In order to make the description clearer, the drawings may schematically show the width, thickness, shape and the like of each part compared with actual modes. However, the examples shown in the drawings are merely an example and the interpretation of the present invention is not necessarily limited based on the size relationships and shapes of each part. In the specification and the drawings, the same reference symbols are attached to the same components as those described previously and a detailed description may be omitted appropriately.

In the present specification and the claims, in the case when "on" or "below" is simply used when describing an aspect in which another structure is arranged on a certain structure, unless otherwise specified, it defines both the case where another structure is placed directly above or directly below a certain structure in contact with that structure, or the information of one structure or below it and another structure is passed through another structure.

In the initialization operation described above, a certain amount of time is necessary to ensure the transition of a display element to a non-display state. However, the control time per unit line becomes shorter as the definition of the display device becomes higher. As a result, there may be a problem that occurs when the operation shifts to the next image signal writing operation without sufficiently completing the initialization operation.

In view of the problems described above, an object of the present invention is to provide a display device that can reliably perform an initialization operation and can obtain high-quality display image quality.

<Display Device Structure and Operation>

FIG. 1 shows a structure of a display device 100 according to an embodiment of the present invention. The display device 100 has, above a substrate 502, a display region DA in which a pixel PX including a display element OLED is formed, and a periphery area PA surrounding the display region DA.

Although only one pixel PX is shown in FIG. 1, the display region DA is actually formed by arranging a plurality of pixels in a matrix. Here, the matrix arrangement refers to a mode in which a plurality of pixels are arranged in two dimensions in a row direction and a column direction. The arrangement direction may be a vertical and horizontal arrangement which is parallel to the X-axis direction or the Y-axis direction, or may have an arrangement direction such as a pentile arrangement in which the X-axis and the Y-axis intersect each other.

The periphery area PA includes a data driving circuit DD and a scanning circuit GD for controlling the display region DA. The function of the data drive circuit DD is to supply an image signal which is input to each pixel PX, and the function of the scanning circuit GD is to sequentially select rows to be controlled.

A signal line 1004 and a reset line 1005 extend toward the display region DA from the data drive circuit DD. The signal line 1004 and the reset line 1005 are each connected to a plurality of pixels PX. A scanning line 1003 extends toward the display region DA from the scanning circuit GD. Each of the scanning lines 103 is connected to a plurality of pixels PX.

A flexible printed circuit board (FPC) 512 is connected to a terminal area TA arranged in the periphery area PA. The FPC 512 connects an external circuit (not shown in the diagram) to the display device 100. A control signal, an image signal and power for controlling the display device 100 are input to the display device 100 from an external circuit.

The pixel PX includes a switching transistor SST, a drive transistor DRT, a reset transistor RST, a storage capacitor Cs and a display element OLED respectively. The drive transistor DRT and the display element OLED are connected in series between the high-potential-side power source PVDD and the low-potential-side power source PVSS. The display element OLED has two electrodes. Here, the side connected to the drive transistor DRT is a pixel electrode arranged in each of the pixels PX on the substrate, and the opposing side becomes a pixel electrode arranged in all pixels. The display element OLED emits light when supplied with a current which has a value determined by the drive transistor DRT.

Figure 2:
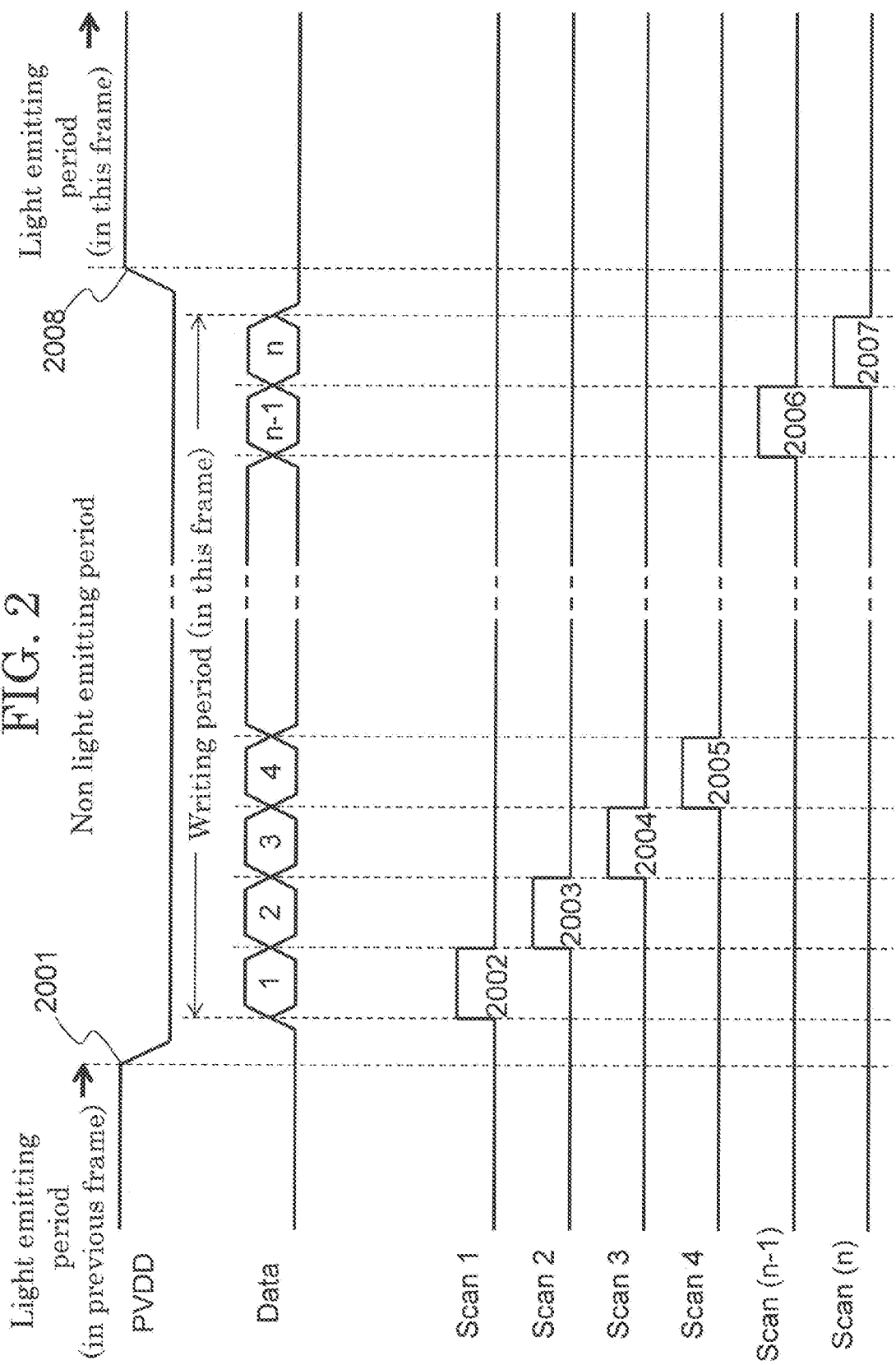
FIG. 2 is a timing chart in a global refresh operation.

Next, control of the display device shown in FIG. 1 is explained. FIG. 2 shows a timing chart of a high-potential-side power source PVDD, an image signal, and each scanning line which is an output of a scanning circuit GD when global refresh driving is performed.

The global refresh drive is a drive method in which an image signal is sequentially written to the pixels PX included in the display region DA, and after all the pixels PX have been written with an image signal, a frame display is simultaneously started simultaneously. The advantages of global refresh driving include easy control of a light emission duty ratio and easy control of blanking drive in which a non-light-emitting period during which a light-emitting period is intermittently performed in order to reduce an afterimage phenomenon of a moving image.

Details are explained with reference to FIG. 2. First, when the potential of the high-potential-side power source PVDD is lowered from the light emitting period (previous frame) already performed, the current supply to the display element OLED is terminated, and the light emission is forcibly stopped. That is, the non-light emitting period is started.

After the entire display region DA shifts simultaneously to the non-emission period, the scanning circuit GD sequentially outputs pulses to the scanning lines and sets the rows from which a pulse has been output to a selected state (2001, 2002, 2003, . . . ). In the row being a selected state, an image signal output to the signal line is written at that timing.

As is shown in FIG. 1, the image signal is input from the signal line 1004 to the gate of the drive transistor DRT via the switching transistor SST. On the other hand, the source side of the drive transistor DRT is fixed to the potential of the reset line 1005 (Vrst) via the reset transistor RST. The potential of the reset line 1005 (Vrst) may be appropriately determined between the high-potential-side power source PVDD and the low-potential-side power source PVSS. The potential difference between the potential of the reset line 1005 (Vrst) and the low-potential-side power source PVSS is sufficiently small so that the display element OLED does not emit light. In other words, the potential difference is preferably a light emitting voltage of the display element OLED which is lower than the potential difference between the potential of the reset line 1005 (Vrst) and the low-potential-side power source PVSS. For example, the potential difference between the potential of the reset line 1005 (Vrst) and the low-potential-side power source PVSS may be the same as the low-potential power supply PVSS.

In a state where all the rows are in a non-selected after all the scanning lines are selected (in this case, the nth row (Scan (n)) are selected (2007)) and the writing of the image signal is completed, a potential of the high-potential-side power source PVDD is increased (2008). As a result, a voltage is applied to the display element OLED, a current having a value determined by the drive transistor DRT is supplied to the display element OLED, and the display element OLED emits light. This state is continued until the start of the next non-light emitting period.

Furthermore, although not specifically shown, as described above, after the transition to the light emitting period and before the start of the next writing period, the blanking driving is performed by intermittently lowering the potential of the high-potential-side power source PVDD at an arbitrary timing. In this case, the image signal written to each pixel PX is held as a voltage between a gate and a source of the drive transistor DRT by the storage capacitor Cs. Therefore, even if the source of the drive transistor DRT is changed by a change in the potential of the high-potential-side power source PVDD such as the potential of the pixel electrode fluctuates, the voltage between the gate and the source of the drive transistor DRT is kept constant by the coupling of the storage capacitor Cs. Therefore, the image can be displayed again after the blanking driving.

Then, in the global refresh driving as described above, the following cases can be considered.

Before the writing period starts, the current supplied to the display element OLED via the drive transistor DRT is terminated by lowering the potential of the high-potential-side power source PVDD. As a result, the electric charge which is present in the drain and the source of the drive transistor DRT transfers to the low-potential-side power source PVSS side, and the potential of the drain and the source of the driving transistor decreases so that the display element OLED stops emitting light. When the potential of the high-potential-side power source PVDD is sufficiently decreases, and the writing period is starting.

However, as the definition becomes higher, the margin of the writing time runs out. In this case, the period (from 2001 to 2002 in FIG. 2) in which the writing of the image signal is started in the first row after the potential of the high-potential-side power source PVDD is lowered is shortened. In the state where the potentials of the source and the drain of the drive transistor have not completely dropped, writing of the image signal is started in the first row is started. At this time, a through current passes to the reset line 1005 from the drive transistor DRT via the reset transistor RST. When this current occurs during this writing time, a potential between the gate and the source of the drive transistor DRT may no longer be accurately determined.

If the write time of the first row is sufficiently long, the potential of the source of the drive transistor DRT eventually becomes equal to the potential of the reset line 1005 (Vrst) becomes equal even if the through current is generated once. As a result, the voltage between the gate and the source can be determined. However, such an effect cannot be expected when the writing time per one row is limited to as the definition become higher.

Since this phenomenon does not occur in the second and subsequent rows, variation in writing of an image signal occurs between the first and second row. Such variations may lead to a display failure, for example, in which only one row at the edge of the screen has a different luminance.

Therefore, the inventors came up with a method for solving this problem. The details are explained below.

First Embodiment

Figure 3:
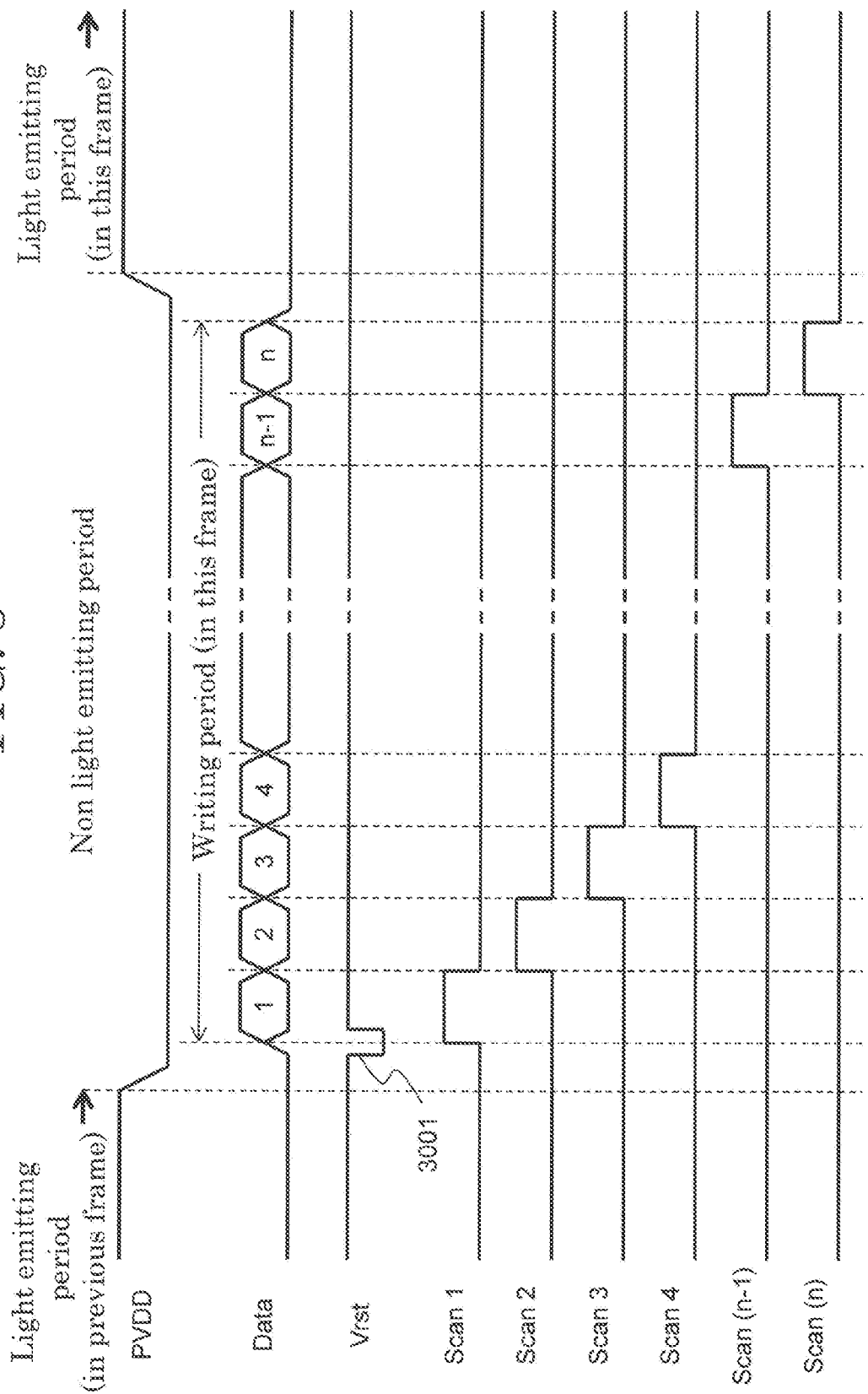
FIG. 3 is a timing chart showing one embodiment of the present invention.

As is shown in FIG. 3, after the potential of the high-potential-side power source PVDD is lowered and before the writing period of the first row starts, the potential of the reset line 1005 (Vrst) is set to a second reset potential which is lower than a normal first reset potential (3001). When, shifting to a writing period in this state, at the timing when the reset transistor RST is turned on, the potential difference between the source of the driving transistor DRT and the reset line 1005 becomes larger than a conventional potential. As a result, the potential of the source of the drive transistor quickly decreases. That is, the potential of the source of the drive transistor DRT falls like an overshoot. However, if the writing of the image signal is completed in this state, the potential difference between the gate and the source in the drive transistor DRT becomes a value different from the original potential difference between the gate and the source in the drive transistor DRT, and the potential of the line 1005

(Vrst) returns to the original potential some time after the start of the writing period. In this state, the writing of the image signal is completed.

After the second and subsequent rows, since there is sufficient time before the writing period starts after the potential of the high-potential-side power source PVDD is lowered, the source of the drive transistor DRT can be set to a desired potential without performing the particular operation described above. Therefore, thereafter, the potential of the reset line 1005 (Vrst) becomes constant with the initial value.

According to the operation described above, in the writing period of the first row, since the potential on the source side of the drive transistor DRT can be quickly reduced to a desired value, a normal image signal writing operation can be realized.

Figure 5:
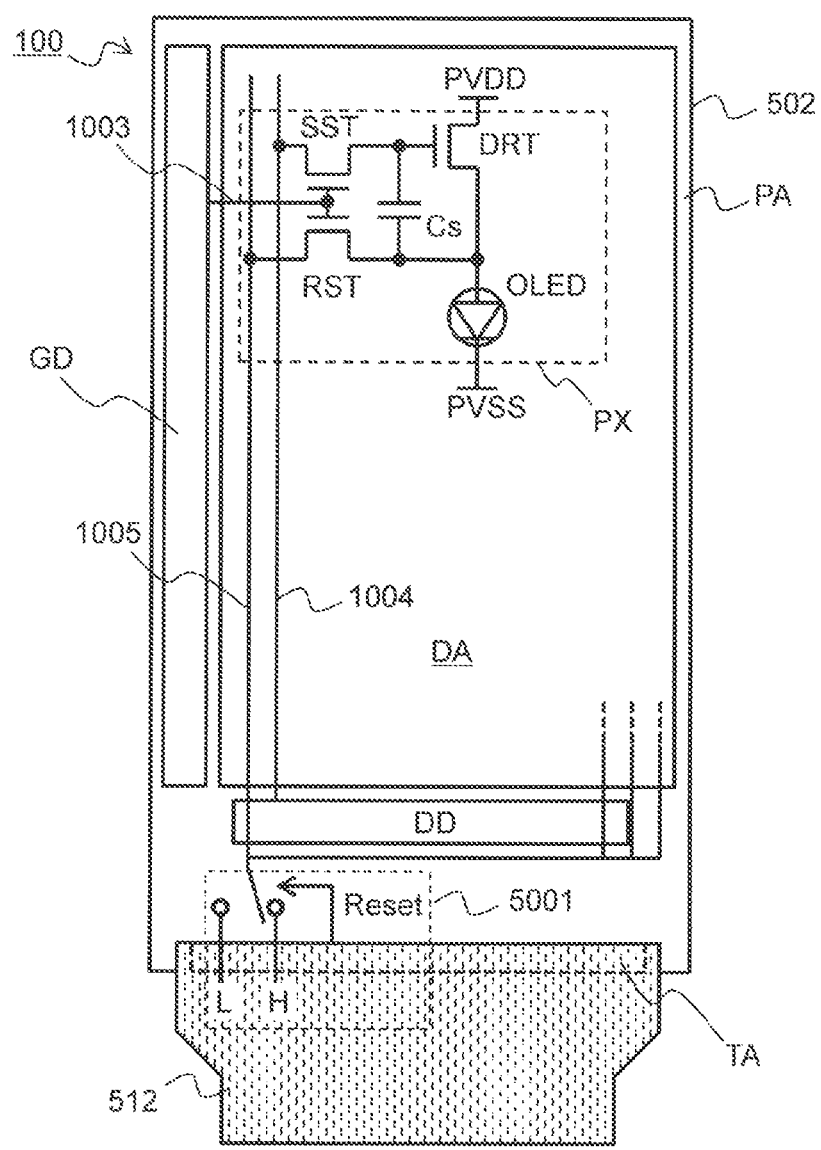
FIG. 5 is a diagram showing a structure of a display device related to one embodiment of the present invention.

A reset potential selection unit 5001 is arranged on a supply source side to the reset line 1005 as shown in FIG. 5 as a structure of a display device for performing the operation described above. Switch control may be performed by a reset signal (Reset) to select a normal first reset potential (H) or a lower second reset potential (L). Since the reset signal (Reset) is a pulse that is input only once at the beginning of the writing period of one frame, the reset signal (Reset) may be generated based on, for example, a vertical synchronization signal.

Embodiment Two

The reset lines 1005 extend in the column direction, that is, in the vertical direction in FIG. 1 and FIG. 5, and a plurality are arranged in the row direction, that is, a horizontal direction. As described above, in the case when the reset potential is directly changed, the potentials of all the reset lines 1005 (Vrst) must be changed. However, if all the potentials of all the reset lines 1005 (Vrst) for all the rows are changed, a large amount of power is consumed for charging and discharging the reset lines 1005. As a result, in the structure described above, a reset potential lower than usual is applied only to the first row, which may be a problem at present.

Figure 4:
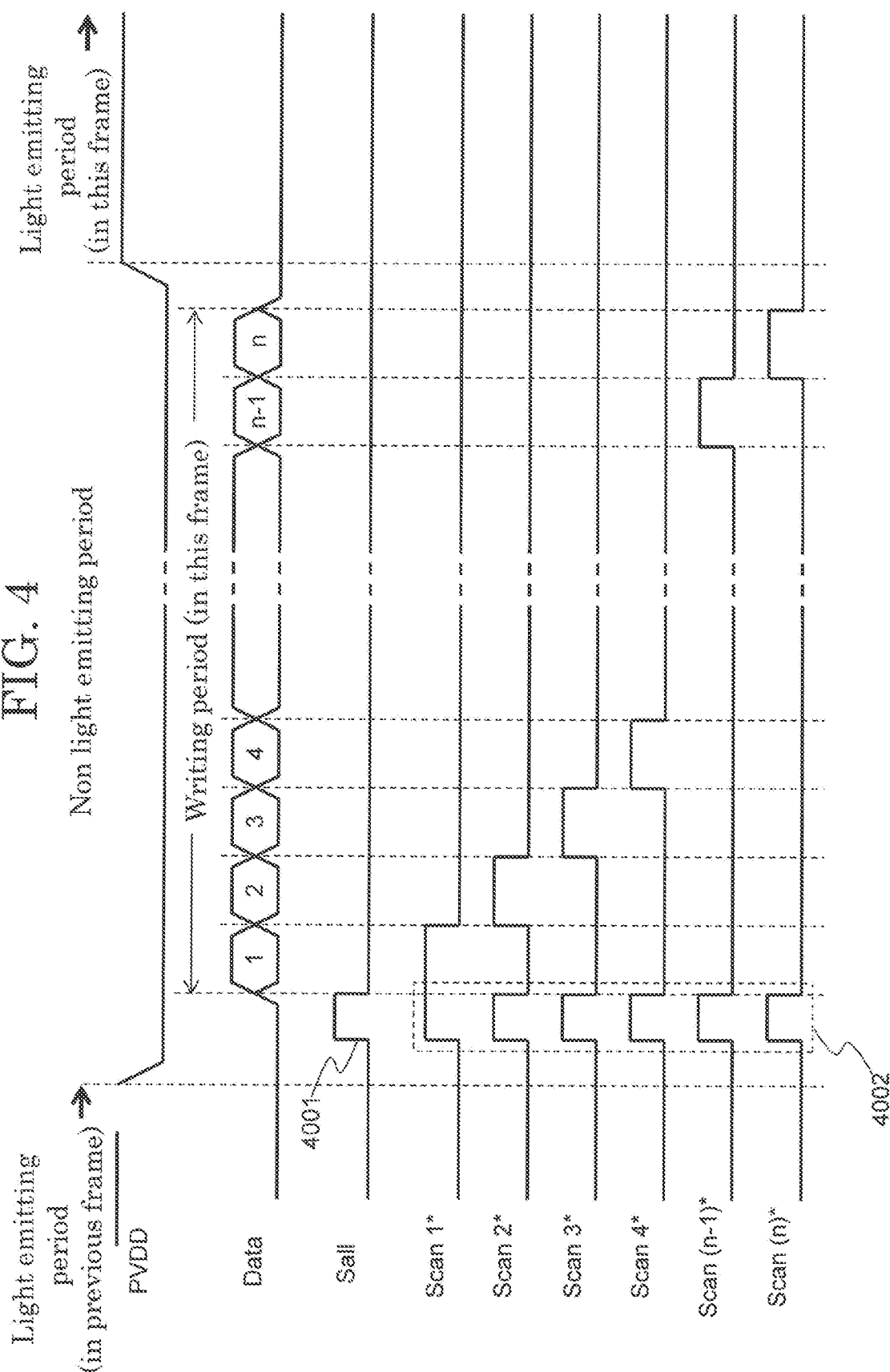
FIG. 4 is a timing chart showing another embodiment of the present invention.

On the other hand, in order to achieve uniform display quality, it is preferable to perform the write operation under the same conditions in all rows. Therefore, as is shown in FIG. 4, after lowering the potential of the high-potential-side power source PVDD and before the start of the writing period of the first row, an all-selection signal (Sall) is input (4001), and a timing is arranged for putting all the rows in a temporarily selected state (4002).

This operation simultaneously turns on the switching transistor SST and the reset transistor RST in all the rows included in the display region DA and the reset transistors RST, and the potential of the reset line (1005) is applied to the source of the drive transistor DRT via the reset transistor RST. On the other hand, no image signal is input to the signal line 1004, and a constant potential is input. Although the potential (constant potential) is input to the drive transistor DRT via the switching transistor SST, the drive transistor DRT is turned off by this potential (constant potential). As a result, in all the rows, the potential of the source of the drive transistor DRT is simultaneously reduced to a desired potential.

Thereafter, the writing of the first row starts. In FIG. 4, the pulse based on the all selection signal (Sall) and the original selection pulse of the first row are combined to form one wide pulse. Before starting the writing of the first row, all the rows may be temporarily unselected.

Although the writing operation is performed similarly in the second and subsequent rows, since the potential of the source of the drive transistor DRT is lowered under the same conditions in all the pixels, the state of all the pixels PX can be uniform after completion of the writing operation. Here, "uniform" does not mean that all the pixels PX have the same gray scale, but means that the pixels PX to which the same gray scale is written are uniform.

Figure 6:
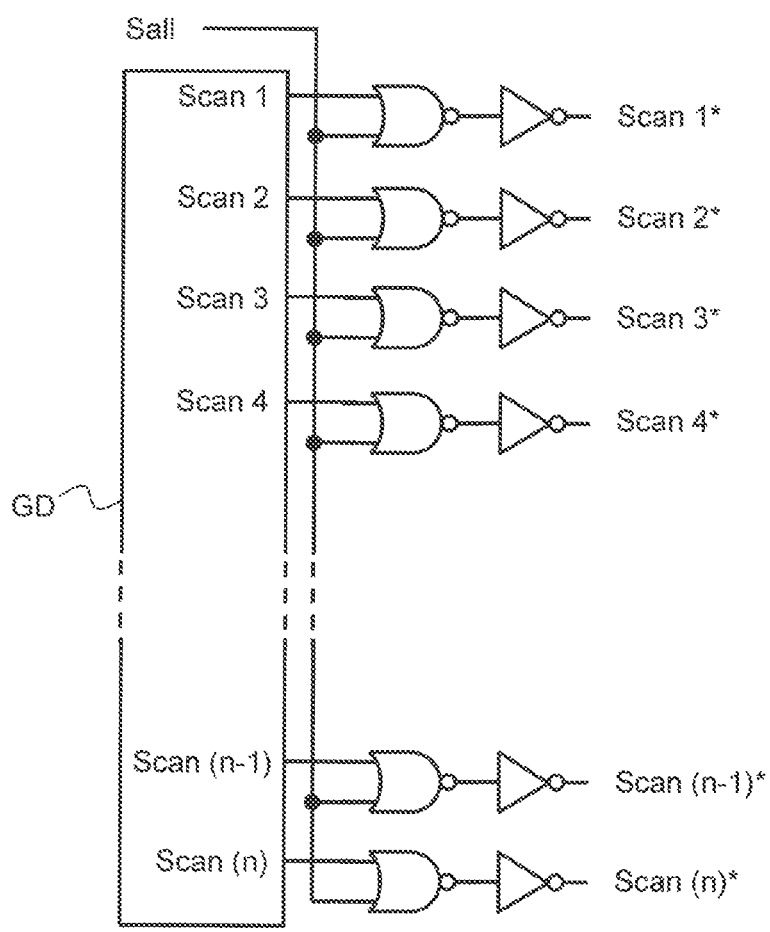
FIG. 6 is a diagram showing a structure of a scanning circuit related to another embodiment of the present invention.

A structure of the scanning circuit GD provided with control by all of selection signals (Sall) is shown in FIG. 6. The output of each stage of the scanning circuit GD is sequentially output as scanning signals (Scan1, Scan2, Scan3, . . . , Scan (n)). In the output of each stage, by taking a logical sum (OR) of all the selected signal (Sall) and scanning signals (Scan1, Scan2, Scan3, . . . , Scan (n)), when a signal is output from a scanning circuit GD or all selected signal (Sall) is input, a pulse (Scan1\*, Scan2\*, Scan3\* . . . Scan (n)) is outputting. Of course, the structure of a scanning circuit GD shown in FIG. 6 is merely the example of the structure of the scanning circuit GD, and a circuit having another structure may output a pulse in accordance with the timing chart in FIG. 4.

<Process Structure of Display Device>

FIG. 7 is a schematic cross sectional view of a display device according to one embodiment of the present invention. The cross section along the line A1-A2 in FIG. 1 is located along the line A1-A2 in FIG. 7.

The display device 100 is arranged with a semiconductor layer 142 over an upper surface of a substrate 502 and via a base film 501 having an arbitrary structure.

A drive transistor 434 is arranged above the base film 501. The driving transistor 434 includes a semiconductor layer 142, a gate insulating film 144, a gate electrode 146, and a source electrode and drain electrode 154. The source or drain electrode 154 and the storage capacitor (not illustrated in the diagram) may be formed by injecting impurities into the semiconductor layer 142. The gate electrode 146 overlaps the semiconductor layer 142 via the gate insulating film 144. A region where the semiconductor layer 142 and the gate electrode 146 overlap is a channel region of the driving transistor 434. The semiconductor layer 142 may have source and drain regions so as to sandwich the channel region. The insulating film 108 can be arranged over the gate electrode 146.

In addition, in FIG. 7, transistors are illustrated as top-gate transistors. the structure of the drive transistor 434 is not limited to this structure, and the structure of the driving transistor 434 may be, for example, a bottom-gate transistor, a multi-gate transistor having a plurality of gate electrodes 146, or a dual-gate transistor having a structure and a semiconductor layer 142 includes two gate electrodes 146. In addition, FIG. 7 shows one transistor 102 has three sub-pixels, a sub-pixel 130, a sub-pixel 132 and a sub-pixel 134. In addition, an example is shown in FIG. 7 in which one drive transistor 434 is arranged for each sub-pixel 130, each sub-pixel 132 and each sub-pixel 134. Each sub-pixel 130, each sub-pixel 132 and each sub-pixel 134 may further include a semiconductor element such as a plurality of transistors and a capacitor element.

Although not specifically shown in FIG. 7, transistors included in the scanning circuit GD, the data driving circuit DD, and the like may be formed using transistors formed in the same layer as the drive transistor 434.

An insulating film 108 is arranged over the transistor. The insulating film 108 has a function of insulating the surface of the transistor and other semiconductor elements and a function as a dielectric of a capacitor element which is formed later. An inorganic insulating film such as a silicon oxide film, a silicon nitride film, or a silicon oxynitride film can be used as the insulating film 108.

The capacitor line 412 is arranged above the insulating film 108. A reset line 414 is arranged in the same layer as the capacitor line 412. Furthermore, the capacitance line 412 and the gate electrode 146 overlap.

Furthermore, an insulating film 114 is arranged. The insulating film 114 has a function for absorbing unevenness due to a transistor or another semiconductor element and providing a flat surface. The insulating film 114 can be formed using an organic compound material selected from acrylic, polyimide, or the like, which has excellent planarity om terms of a film surface. However, in the case where a capacitor is formed between the upper conductive layer and the insulating film 114 using the capacitor line 412 as a dielectric, it is possible to use a silicon oxide film similar to the insulating film 108, a silicon nitride film, or an inorganic insulating film such as a silicon oxynitride film can be used.

In the gate insulating film 144, the insulating film 108, and the insulating film 114, an opening 152_1 which reaches the semiconductor layer 142 is arranged. At the same time, an opening (not shown in the diagram) which reaches the gate electrode 146 is arranged in the insulating films 108 and 114. In addition, an opening (not shown in the diagram) which reaches the capacitor line 412 is arranged in the insulating films 108 and 114.

Next, a conductive layer 440_3 is arranged in the same layer as the image signal line, the driving power source line, and the image signal line. The conductive layer 440_3 is electrically connected to the semiconductor layer 142 or the source or drain electrode 154 through the opening 152_1. The first terminal wiring 210 is also arranged in the same layer as the image signal line. Although not shown in the same diagram, the first terminal wiring 210 may be formed to exist in the same layer as the gate electrode 146.

Next, an insulating film 148 is arranged. The insulating film 148 has a function for absorbing unevenness due to a transistor or another semiconductor element to provide a flat surface, and is formed using an organic compound material selected from acrylic, polyimide, or the like which has excellent flatness film surface properties. In addition, an inorganic insulating film 150 may be formed over the insulating film 148. In addition, a pixel electrode 162 of the light-emitting element 160 described below is formed below the inorganic insulating film 150, and an electrode (not shown in the diagram) formed so as to sandwich the inorganic insulating film 150 may be formed below the inorganic insulating film 150. At this time, a capacitor can be formed between the pixel electrode 162 and an electrode (not shown in the electrode) formed so as to sandwich the inorganic insulating film 150 via the inorganic insulating film 150.

A plurality of openings are provided in the insulating film 148 and the inorganic insulating film 150. One of them is the opening 190. The opening 190 electrically connects a pixel electrode 162 of the light-emitting element 160 described later to the conductive layer 440_3 and a wiring arranged in the same layer as the conductive layer 440_3. One of the openings is a contact hole 208 which is used for electrical connection between the first wiring 206 and the first terminal wiring 210. One of the openings is an opening 156 which is arranged so as to expose a part of the first terminal wiring 210. The first terminal wiring 210 exposed at the opening 156 is connected to a flexible printed circuit board (FPC) 512 by, for example, an anisotropic conductive film 252 or the like.

The light emitting element 160 is formed over the insulating film 114 and the inorganic insulating film 150. The light emitting element 160 includes a pixel electrode 162, a functional layer 164, and a common electrode 166. More specifically, the pixel electrode 162 is arranged to cover the opening 190 and be electrically connected to the conductive layer 440_3. In this way, a current is supplied to the light emitting element 160 via the drive transistor DRT. An insulating film 168 is arranged to cover an end part of the pixel electrode 162. The insulating film 168 is a partition wall. The partition covers the end part of the pixel electrode 162 so that disconnection of the functional layer 164 and the common electrode 166 arranged thereon can be prevented. The functional layer 164 is arranged so as to cover the pixel electrode 162 and the partition wall, and the common electrode 166 is arranged thereover. Carriers are injected into the functional layer 164 from the pixel electrode 162 and the common electrode 166, and recombination of the carriers occurs in the functional layer 164. Accordingly, the light-emitting molecules in the functional layer 164 are excited and light is obtained through a process of relaxation the light-emitting molecules to a ground state. Therefore, a region where the pixel electrode 162 and the functional layer 164 are in contact is a light emitting region in each of the sub-pixel 130, the sub-pixel 132 and the sub-pixel 134.

The structure of the functional layer 164 can be appropriately selected, and for example, can be formed by combining a carrier injection layer, a carrier transport layer, a light emitting layer, a carrier blocking layer and an exciton blocking layer and the like. FIG. 7 shows an example in which the functional layer 164 includes three layers 170, 176, and 174. In this case, for example, the layer 170 can be a carrier (hole) injection and transport layer, the layer 176 can be a light emitting layer, and the layer 174 can be a carrier (electron) injection and a transport layer. The layer 176 which is a light-emitting layer can be formed to include a different material for the sub-pixel 130, each sub-pixel 132, and each sub-pixel 134. In this case, the other layers 170 and 174 are formed over the sub-pixel 130, each sub-pixel 132, each sub-pixel 134, and the partition wall so as to be shared by the sub-pixel 130, each sub-pixel 132, and each sub-pixel 134. By appropriately selecting the material which is used for the layer 176, different emission colors can be obtained in the sub-pixel 130, each sub-pixel 132, and each sub-pixel 134. Alternatively, the structure of the layer 174 may be the same between the sub-pixel 130, each sub-pixel 132, and each sub-pixel 134. In this case, the layer 174 may be formed over each sub-pixel 130, each sub-pixel 132, each sub-pixel 134, and the partition wall so as to be shared by each sub-pixel 130, each sub-pixel 132, and each sub-pixel 134. In such a structure, the same emission color is output from the layer 176 of each sub-pixel 130, each sub-pixel 132, and each sub-pixel 134. Therefore, for example, the layer 176 is formed to emit white light, and various layers are formed using color filters. (For example, red, green, and blue) may be extracted from the sub-pixels 130, 132, and 134, respectively.

Furthermore, the display device 100 may further include connection electrodes 234 and 236 which cover the contact hole 208 and the opening 156 and are in contact with the first terminal wiring 210. These connection electrodes 234 and 236 can exist in the same layer as the pixel electrode 162. By forming the connection electrodes 234 and 236, it is possible to reduce damage to the first terminal wiring 210 in the manufacturing process of the display device 100, and electrical connection with low contact resistance can be realized.

A sealing film 180 is arranged over the light emitting element 160. The sealing film 180 is also called a passivation film. The sealing film 180 has a function for preventing impurities (water, oxygen, and the like) from entering the light-emitting element 160 and the transistor from the outside. As is shown in FIG. 7, the sealing layer 180 can include three layers. For example, among the three layers, an inorganic film containing an inorganic compound can be used for the first layer and the third layer. Specifically, a first inorganic film 182 and a second inorganic film 186 can be used. On the other hand, a film containing an organic compound selected from acrylic, polyimide, or the like (organic film 184) can be used as the second layer between the first inorganic film 182 and the second inorganic film 186. The organic film 184 can be formed to absorb unevenness due to the light-emitting element 160 and the partition wall so as to provide a flat surface. As a result, the thickness of the organic film 184 can be made relatively large.

Furthermore, the first inorganic film 182 and the second inorganic film 186 are preferably formed to cover at least the display region 504. Furthermore, the first inorganic film 182 and the second inorganic film 186 are preferably formed to not overlap with the contact hole 208 and the opening 156. In this way, electrical connection with low contact resistance between the first terminal wiring 210 and the flexible printed circuit board (FPC) 512 or the first wiring 206 can be achieved. Furthermore, it is preferred that the first inorganic film 182 and the second inorganic film 186 be in direct contact with each other around the display region 504 (refer to the region surrounded by a circle 188). In this way, the organic film 184 which has a higher hydrophilicity than the first inorganic film 182 and the second inorganic film 186 can be sealed with the first inorganic film 182 and the second inorganic film 186, and intrusion of impurities from the outside and diffusion of impurities in the display region 504 can be prevented more effectively.

A cover film 268 is arranged over the second inorganic film 186. The first terminal wiring 210 is arranged so as to be in contact with a region in which the insulating film 114, the insulating film 108, the gate insulating film 144, and the base film 501 are open and the substrate 502. The region is a region where the display device 100 can be bent. The cover film 268 protects the surface of the display device 100 up to this bendable region. In addition, a cover film 269 may be provided below the base film 501. The cover film 269 protects the base film 501 from being damaged and also protects the rear surface of the display device 100. Furthermore, the cover film 268 and the cover film 269 may not be provided, or may extend to a region where the cover film 268 can be bent if the cover film 268 itself is a material having sufficient flexibility for bending.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A display device having a display region, the display region having a plurality of pixels, each of the plurality of pixels comprising:
    a switching transistor having a gate electrically connected to a scanning line and controlling the input of an image signal provided from a signal line;
    a drive transistor input with the image signal through the switching transistor and controlling a current value based on the image signal;
    a display element having a first electrode electrically connected to the driving transistor and emitting light by a current supplied through the drive transistor;
    a storage capacitor having a first electrode electrically connected to a gate of the drive transistor; and
    a reset transistor connected between the first electrode of the display element and a reset line, and having a gate electrically connected to the scanning line,
    wherein
    an input of an image signal to the plurality of pixels is configured to be sequentially performed at each row,
    the start and end of light emission of the display element are configured to be simultaneously performed in all pixels; and
    until the end of the input of the image signal of the first row via an input start timing of an image signal of a first row after the end of the light emission of the display element, the potential of the reset line shifts to a second reset potential lower than a first potential from the first reset potential.

2. A display device having a display region, the display region having a plurality of pixels, each of the plurality of pixels comprising:
    a switching transistor having a gate electrically connected to a scanning line and controlling the input of an image signal provided from a signal line;
    a drive transistor input with the image signal through the switching transistor and controlling a current value based on the image signal;
    a display element having a first electrode electrically connected to the driving transistor and emitting light by a current supplied through the drive transistor;
    a storage capacitor having a first electrode electrically connected to a gate of the drive transistor; and
    a reset transistor connected between the first electrode of the display element and a reset line, and having a gate electrically connected to the scanning line,
    wherein
    an input of an image signal to the plurality of pixels is configured to be sequentially performed at each row,
    the start and end of light emission of the display element are configured to be simultaneously performed in all pixels; and
    until up to before an input start of an image signal of the first row after the end of the light emission of the display element, the scanning lines on all of the rows are in a state where they can be simultaneously selected.

3. The display device according to claim 1, wherein the drive transistor and the display element are connected in series between a high-potential-side power source and a low-potential-side power source lower than the high-potential-side power source, and the first reset potential is a potential between the high-potential-side power source and the low-potential-side power source, and has a smaller potential difference with respect to the low-potential-side power source than a potential difference with respect to the high-potential-side power source.

4. The display device according to claim 2, wherein the drive transistor and the display element are connected in series between a high-potential-side power source and a low-potential-side power source lower than the high-potential-side power source, and the potential of the reset line is a potential between the high-potential-side power source and the low-potential-side power source, and has a smaller potential difference with respect to the low-potential-side power source than a potential difference with respect to the high-potential-side power source.

5. A driving method for a display device, the display device having a display region, the display region having a plurality of pixels, each of the plurality of pixels comprising:
   a switching transistor having a gate electrically connected to a scanning line and controlling the input of an image signal provided from a signal line;
   a drive transistor input with the image signal through the switching transistor and controlling a current value based on the image signal;
   a display element having a first electrode electrically connected to the driving transistor and emitting light by a current supplied through the drive transistor;
   a storage capacitor having a first electrode electrically connected to a gate of the drive transistor; and
   a reset transistor connected between the first electrode of the display element and a reset line, and having a gate electrically connected to the scanning line,
   wherein
   the drive transistor and the display element are connected in series between a high-potential-side power source and a low-potential-side power source lower than the high-potential-side power source, and
   the driving method comprising the steps of:
   a first step of falling a potential of the high-potential-side power source, and terminating light emission of the display element at the same time in the plurality of pixels;
   a second step of, after terminating light emission of the display element, shifting a potential of the reset line from the first reset potential to a second reset potential lower than the first reset potential;
   a third step of sequentially inputting an image signal from a first row until the end row in the plurality of pixels;
   a fourth step of, after input of the image signal in the end row is completed, raising a potential of the high-potential-side power source, and starting light emission of a display element based on each input image signal at the same time to the plurality of pixels; and
   the second step finishes after the start of an input of the image signal in the first row.

6. A driving method for a display device, the display device having a display region, the display region having a plurality of pixels, each of the plurality of pixels comprising:
   a switching transistor having a gate electrically connected to a scanning line and controlling the input of an image signal provided from a signal line;
   a drive transistor input with the image signal through the switching transistor and controlling a current value based on the image signal;
   a display element having a first electrode electrically connected to the driving transistor and emitting light by a current supplied through the drive transistor;
   a storage capacitor having a first electrode electrically connected to a gate of the drive transistor; and
   a reset transistor connected between the first electrode of the display element and a reset line and having a gate electrically connected to the scanning line,
   wherein
   the drive transistor and the display element are connected in series between a high-potential-side power source and a low-potential-side power source lower than the high-potential-side power source, and
   the driving method comprising the steps of:
   a first step of falling a potential of the high-potential-side power source, and terminating light emission of the display element at the same time in the plurality of pixels;
   a second step of, after terminating light emission of the display element, putting the scanning lines on all the rows into a state where they can be simultaneously selected;
   a third step of sequentially inputting an image signal from a first row until the end row in the plurality of pixels; and
   a fourth step of, after input of the image signal in the end row is completed, raising a potential of the high-potential-side power source, and starting light emission of a display element based on each input image signal at once to the plurality of pixels.

* * * * *